US006990156B2

(12) United States Patent
Chen

(10) Patent No.: US 6,990,156 B2
(45) Date of Patent: Jan. 24, 2006

(54) FREQUENCY OFFSET ESTIMATION FOR COMMUNICATION SYSTEMS METHOD AND DEVICE FOR INTER SYMBOL INTERFERENCE

(75) Inventor: Hung-Kun Chen, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 766 days.

(21) Appl. No.: 10/062,116

(22) Filed: Jan. 30, 2002

(65) Prior Publication Data

US 2003/0053559 A1 Mar. 20, 2003

Related U.S. Application Data

(60) Provisional application No. 60/312,618, filed on Aug. 15, 2001.

(51) Int. Cl.
*H04L 27/14* (2006.01)
(52) U.S. Cl. .................................................. 375/316
(58) Field of Classification Search ................ 375/224, 375/226, 228, 316, 324, 325, 326, 328, 329, 375/330, 331, 332, 340, 354, 355, 362, 377; 341/50, 126, 111, 116; 455/130, 226.1; 708/445, 708/200, 100
See application file for complete search history.

(56) References Cited

U.S. PATENT DOCUMENTS 5,825,756 A * 10/1998 Hattori ........................ 370/319

6,567,480 B1 * 5/2003 Brardjanian et al. ........ 375/331

OTHER PUBLICATIONS

K.E. Scott and E.B. Olasz; "Simultaneous Clock Phase and Frequency Offset Estimation;" IEEE Transactions on Communications, vol. 43, No. 7, Jul. 1995; pp. 2263-2270.
Ahmad R.S. Bahai and Mohsen Sarraf; "A Frequency Offset Estimation Technique for Wireless Channels;" IEEE, 1997; pp. 397-400.
Harish Viswanathan and Rajeev Krishnamoorthy; "A Frequency Offset Estimation Technique for Frequency-Selective Fading Channels;" IEEE Communications Letter, vol. 5, No., 4, Apr. 2001; pp. 166-168.

* cited by examiner

*Primary Examiner*—Mohammed Ghayour
*Assistant Examiner*—Pankaj Kumar
(74) *Attorney, Agent, or Firm*—Thomas, Kayden, Horstemeyer & Risley

(57) ABSTRACT

A frequency offset estimation based on state-based differential accumulation and the device thereof are disclosed. The concept of the sate-based operation is introduced by mathematical derivations. The knowledge of received data symbols and timing is utilized. Then the detailed operations are also given by both equations and conceptual descriptions. It is unnecessary to estimate the channel jointly or concurrently, while the differential operation over the received samples of the same state is performed. Such operation is obviously much simpler and easier to implement in VLSI than all the other techniques.

25 Claims, 2 Drawing Sheets

FREQUENCY OFFSET ESTIMATION FOR COMMUNICATION SYSTEMS METHOD AND DEVICE FOR INTER SYMBOL INTERFERENCE

This application claims benefit to provisional application 60,312,618 filed Aug. 15, 2001.

FIELD OF THE INVENTION

The present invention relates to frequency offset estimations for use in communications systems, and particularly to a frequency offset estimation based on state-based differential accumulation.

BACKGROUND OF THE INVENTION

Many modern communication systems are carrier-modulated systems that transmit information bearing signals through some specified bands. Due to the mismatch between the local oscillators of the transmitter and the receiver, a carrier frequency offset is seen at the receiver. In general, a large frequency offset causes rapid phase rotation, which could be far beyond the tracking capability of the receiver functions, such as the carrier phase tracking loop and the channel estimator. It is thus desired to have an initial frequency offset estimation to reduce the amount of frequency offset seen by the remaining part of the receiver. Some current frequency offset estimation algorithms are based on the ideal channel condition of additive white Gaussian noise (AWGN) and in some applications, a communications channel experiences severe inter-symbol interference (ISI). One example is the multi-path fading channel for wireless communications where ISI leads to extra noise terms and degrades the performance of prior art frequency offset estimations.

Several prior art frequency offset estimation schemes used in the ISI channels are briefly described herein. A "Fourier Coefficients after Non-linear Operation" algorithm performs the following steps:

Do some non-linear operation, such as differential detection,

Calculate the Fourier coefficients for some fundamental frequencies at the output of the non-linear operation, Perform another operation on these coefficients.

Estimate the frequency offset from its phase.

This algorithm does not require knowledge of received data symbols and timing, but it makes some approximations based on the assumption of the channel response. Another prior art scheme, "Jointly Channel and Frequency Offset Estimation", utilizes a maximal-likelihood (ML) type of jointly channel and frequency offset estimator in which the algorithm has to search the maximal point of the non-linear ML equation after certain matrix operations are performed. This algorithm requires the knowledge of received data symbol and timing. The "Phase Rotation of Channel Estimation" method estimates frequency offset by neglecting the effect of frequency offset within a short time, then the frequency offset is estimated by the phase rotation of the channel coefficients. This method splits the channel and frequency offset estimations and requires knowledge of received data symbols and timing. The "Maximum Stated-based Accumulation (MSA)" method utilizes a modified version of the non-linear ML equation which is obtained by collecting the terms corresponding to the same state to form a whole while finding the maximal point of the modified non-linear equation. Knowledge about the received data symbols and timing is required.

SUMMARY OF THE INVENTION

The object of the present invention is to provide a frequency offset estimation system and method utilizing inter-symbol interference in a channel communication system. An advantage of the present invention is that it does not require intensive computation of Fourier coefficients or maximization of any non-linear equations as in the prior art. Further, according to the present invention, it is not necessary to frequency offset-estimate the channel jointly or concurrently while the differential operation over the received samples of the same state is being performed. Thus the present invention is simpler and easier to implement than other prior art techniques.

The present invention provides a frequency offset estimation system and method utilizing a slow channel variation with respect to a predetermined observation time, the channel being treated as in a static condition within an observation window. In a receiving unit of the channel, there are a plurality of data symbols being pre-stored or detected and a receiving sample sequence being received. A predetermined number of data symbols of the plurality of data symbols are defined as a state, and the plurality of data symbols are divided into a first, a second, and up to an $n^{th}$ state, each having a length equal to a predetermined number whereby that predetermined number is smaller then the number of said data symbols. The receiving symbol sequence has a phase shift and an angular frequency offset and is formed by a plurality of receiving sample sections. Each of said plurality of receiving sample sections contains a plurality of samples which are received continuously. The method of the present invention comprises the steps of first executing a complex multiplication of two selected receiving sample sections of the plurality of receiving sample sections of the receiving sample sequence so at to obtain a value wherein the two selective receiving sample sections are mapped to the same state of the data symbol and each receiving sample section is designated by a symbol index whereby the symbol indices form a series of continuous integers corresponding to the respective continuous receiving samples of the received symbol sequence; then dividing the multiplied value by a difference of the respective symbol indices of the two selective receiving sample sections thereby acquiring an estimated frequency offset value; and finally weight-averaging a plurality of estimated frequency offset values for different receiving sample section pairs. The various objects and advantages of the present invention will be more readily understood from the following detailed description when read in conjunction with the appended drawings.

DETAILED DESCRIPTION OF THE INVENTION

Figure 1:
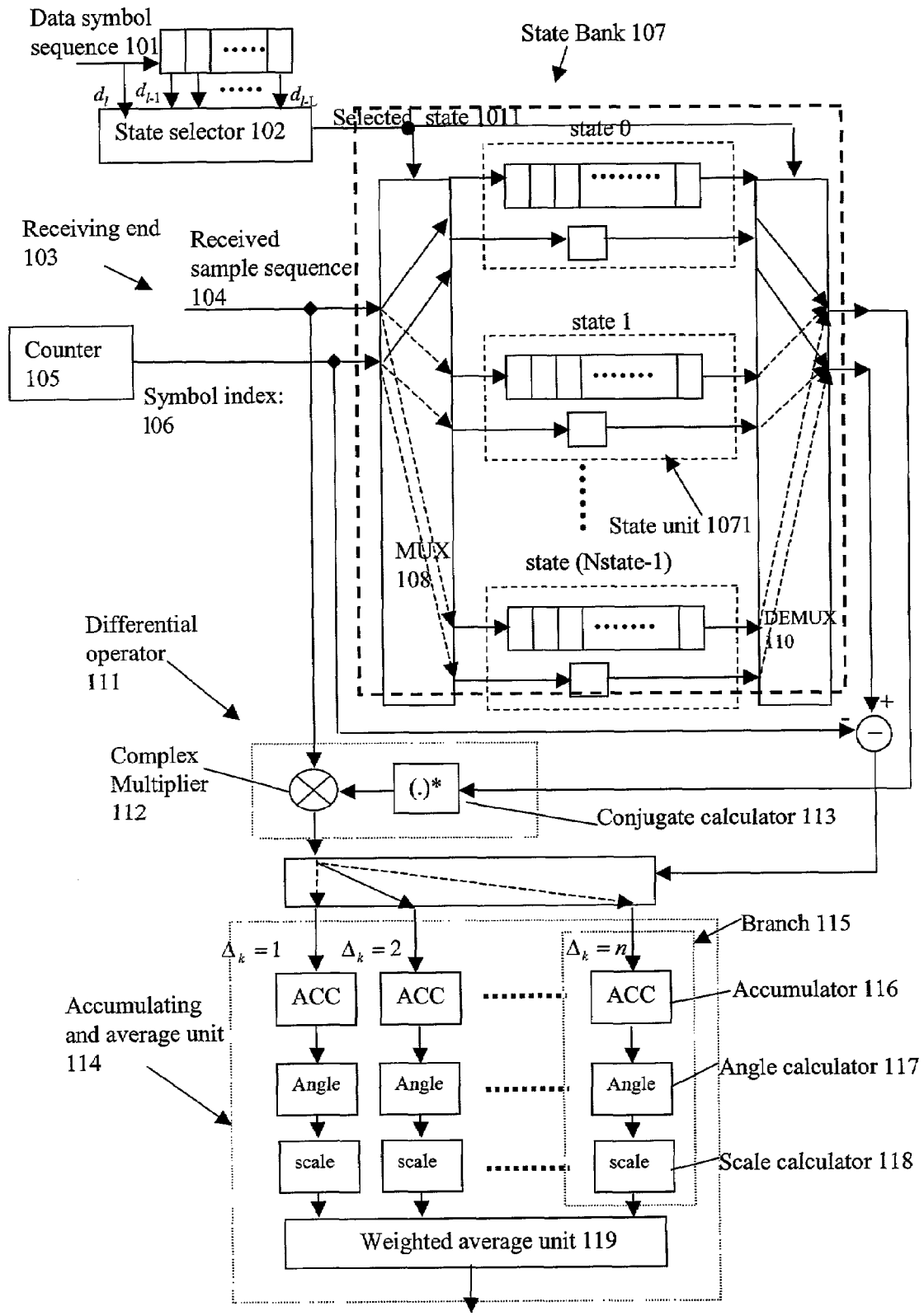
FIG. 1 shows the hardware implementations and block diagrams for the SDA algorithm without state reduction according to the present invention.

The preferred algorithmic embodiment of the present invention is termed the "State-based Differential Accumulation (SDA)" and utilizes knowledge of received data symbols and timing. In the following description of the present invention, the concept of the state-based operation is first described by mathematical derivation. Then the detailed operations are presented utilizing both equations and conceptual descriptions.

Assuming that the channel variation in a communications system is slow with respect to an observation time, and a channel is thus treated as in static condition within an observation window, then a continuous-time received signal can be written as, $$r(t) = Ae^{j\theta}e^{j\omega_d t} \sum_{k=-\infty}^{\infty} d_k g(t-kT) + w(t)$$

where
- A is a scalar and is the gain of the channel,
- $\theta$ is the phase shift of the received signal from the transmitted signal,
- $\omega_d$ is the angular frequency offset of the channel,
- $d_k$ is the k-th transmitted data symbol.
- g(t) is the equivalent composite impulse response combining the effects of transmission pulse shaping filters, channel impulse responses, and receiving filters.
- T is the period of data symbol transmission.
- w(t) is the additive noise process.

Taking samples at a rate of $$\frac{M}{T},$$

a received sample sequence is obtained $$r[n] = r\left(t = n \cdot \frac{T}{M}\right) = Ae^{j\theta}e^{j\omega_d n \frac{T}{M}} \sum_{k=-\infty}^{\infty} d_k g\left(n \cdot \frac{T}{M} - kT\right) + w\left(t = n \cdot \frac{T}{M}\right)$$

$$= Ae^{j\theta}e^{j\frac{\omega_d T}{M}n} \sum_{k=-\infty}^{\infty} d_k g\left(\frac{T}{M}(n-kM)\right) + w\left(t = n \cdot \frac{T}{M}\right)$$

$$= Ae^{j\theta}e^{j\frac{\Omega_d}{M}n} \sum_{k=-\infty}^{\infty} d_k g[n-kM] + w[n]$$

where
$\Omega_d = \omega_d \cdot T$ is the angular shift over one symbol period, and $$g[n] = g\left(t = n \cdot \frac{T}{M}\right)$$

$$w[n] = w\left(t = n \cdot \frac{T}{M}\right)$$

where g[n] and w[n] are the discrete-time sampled version of their continuous-time counterparts.

In the concept of state-based differential operation, for practicality, the impulse response is truncated to some finite length, for example L times the symbol periods. Without loss of generality, assuming that $$g[n] = 0 \; \forall n \notin \{0, 1, 2, \ldots, (LM-1)\}$$

then consider $n = l \cdot M + i$, where $l \in Z, i \in \{0, 1, 2, \ldots, (M-1)\}$, $$r[n = lM + i] = Ae^{j\theta}e^{j\Omega_d(l+\frac{i}{M})} \sum_{k=l-L}^{l} d_k g[(l-k)M + i] + w[n]$$

$$= e^{j\Omega_d(l+\frac{i}{M})} \cdot X(S_l, i) + w[n]$$

where $$X(S_l, i) = Ae^{j\theta} \sum_{k=l-L}^{l} d_k g[(l-k)M + i]$$

$S_l = \{d_{l-L}, d_{l-L+1}, \ldots, d_l\}$ is the state during the l-th symbol.

Then the state is formed by the current and previous L data symbols. Only these symbols contribute to the channel ISI related term, $X(S_l, i)$. The receiving samples of the same state and the same offset i can be used to remove the channel effect and estimate the frequency offset. This can be shown as follows.

Neglecting the noise term, for any $S_{l_1} = S_{l_2}$ and $l_1 \neq l_2$, gives $$X(S_{l_1}, i) = X(S_{l_2}, i).$$

Performing the differential operation and defining a new variable for the result, gives $$u_i(l_1, l_2) = r^*[l_1 M + i] r[l_2 M + i] = e^{j\Omega_d(l_2 - l_1)} \cdot |X(S_{l_1}, i)|^2$$

The angle of the differential operation result contains the frequency offset information. Thus, the frequency offset can be obtained by $$\Omega_d = \frac{1}{\Delta_l} \angle u_i(l_1, l_2)$$

where $\Delta_l = l_2 - l_1$ is the index difference.

To reduce the variance of the estimator, multiple occurrences at the output of the differential operator can be accumulated before taking the phase. For different values of the index difference $\Delta_l$, the accumulation is preferably done separately since they are not coherent in phase. The accumulation variable can be calculated as $$V(\Delta_l) = \sum_{\substack{l_2 - l_1 = \Delta_l \\ S_{l_2} = S_{l_2}}} \sum_{i=0}^{M-1} u_i(l_1, l_2)$$

For any two indices spaced with $\Delta_l$ and having the same state, a differential operation is executed with their corresponding samples and the results are accumulated according to the accumulation variable of the index difference $\Delta_l$. Frequency offset can be estimated from each of the accumulation variables by $$\Omega_d^{\Delta_l} = \frac{1}{\Delta_l} \angle V(\Delta_l)$$

Due to the ambiguity from phase wrap-around, the resolvable range of the estimator is $$|\Omega_d^{\Delta_l}| < \frac{\pi}{\Delta_l}.$$

This leads to a consideration to avoid using large values of $\Delta_l$.

A weighted average can be performed over the frequency estimation from different values of $\Delta_l$, $$\Omega_d = \frac{1}{\sum_{\Delta_l=1}^{\Delta_{l,\max}} C(\Delta_l)} \sum_{\Delta_l=1}^{\Delta_{l,\max}} C(\Delta_l) \cdot \Omega_d^{\Delta_l}$$

where $C(\Delta_l)$, $\Delta_l = 1, 2, \ldots, \Delta_{l,\max}$ are the weighting factors.

A maximal value of $\Delta_l$ is set under the consideration of frequency estimation range, as described above. The selection of weighting factor preferably minimizes the variance of estimation, and it may also take implementation complexity into account. In a simplest way, equal weights can be applied. Alternatively, the weighting factor can be proportional to the relative frequency of occurrences of $\Delta_l$. If the statistics of the data symbol sequence is known and fixed, the weighting factors can be calculated in advance. Otherwise, a set of counters is used to dynamically count the number of the occurrences of each $\Delta_l$. Then the counter values are used to generate the weighting factors.

The method of the present invention can be summarized as the following rules;

Execute a complex multiplication of two segments in a receiving sample sequence, wherein the two segments are mapped to the same state of a series of data symbols and each segment is indicated by a symbol index; and the symbol indexes are a series of continuous integers corresponding to respective continuous segments of the received symbol sequence;

Divide the multiplied value by a difference value of respective symbol indexes of the two segments so as to acquire an estimated frequency offset value; and Obtain an average estimated frequency offset value by weighted-averaging a plurality of estimate frequency offset values for different segments.

The number of the states is $M_d^{L+1}$ where $M_d$ is the size of the set of the data symbol. The present invention preferably reduces the number of states. Consider a rotated received samples by the complex conjugate of the data symbol, and neglecting the noise term;

$$r_R[n = lM + i] = d_l^* \cdot r[n = lM + i]$$

$$= A e^{j\theta} e^{j\Omega_d(l + \frac{i}{M})} \sum_{k=l-L}^{l} d_l^* d_k g[(l-k)M + i]$$

-continued
$$= e^{j\Omega_d(l + \frac{i}{M})} \cdot X(S_{R,l}, i)$$

where $$S_{R,l} = \{d_l^* d_{l-L}, d_l^* d_{l-L+1}, \ldots, d_l^* d_l\} = d_l^* \cdot \{d_{l-L}, d_{l-L+1}, \ldots, d_l\} = d_l^* \cdot S_l$$

It is seen that phase rotation to the received samples causes the same phase rotation to the states. Also note that the state after rotation becomes $$S_{R,l} = \{d_l^* d_{l-L}, d_l^* d_{l-L+1}, \cdots, d_l^* d_l\}$$

$$= \{d_l^* d_{l-L}, d_l^* d_{l-L+1}, \cdots, |d_l|^2\}.$$

In the case of PSK modulation, the last element in the state is a constant. The number of the states becomes $M_d^L$, and the reduction factor is $M_d$. In a more general way, the rotation phase can also be a mapping function from the data symbol other than its complex conjugate.

For the case of spread spectrum, if the spreading code or spreading waveform is periodic with the same period as the symbol time, the spreading waveform can be viewed as part of the pulse shaping and can be absorbed into the equivalent composite impulse response. Since the method of the present invention does not require the knowledge of pulse shaping or channel impulse response, it is also applicable to spread spectrum communication systems.

A block diagram without state reduction is shown in FIG. 1. The operations in the block diagrams are explained as follows. The detailed and mathematical descriptions of each operation are described above. FIG. 1 illustrates a frequency offset estimation circuit according to the present invention. The circuit comprises a state selector 102, a receiving end 103, a state bank 107, a differential operator 111 and an accumulating and averaging unit 114. The state selector 102 determines a current state as a selective state (1011) based on the current and some previous data symbols (101) which is pre-stored in the receiving end 103 or is roughly detected by the receiving end 103, the state selector outputs the selected state (1011). The receiving end 103 serves for receiving a receiving sample sequence (104) and having a counter 105 for generating a symbol index (106) responsive to the input sample sequence (104). The receiving end outputs the received sample sequence (104) and the symbol index (106). The state bank 107 has inputs of the selected states (1011) from the state selector 102, received sample sequence (104) from the input end 103 and a symbol index (106) from the counter 105. The state bank 107 divides the received sample sequence (104) into a plurality of data sample sections responsive to the selected state (1011). Each state unit stores one of the plurality of sample sections and a symbol index of last-time visit. Only contents of a selected state are modified responsive to the selected state (1011) and the symbol index (106). Then a selected sample section and a selected symbol index of the last-time visit are shifted to an output end of the state bank 107. The contents of the state are then updated by new values of the sample sections and the symbol index. The state bank 107 outputs the samples sections and the selected symbol index of the last-time visit. The differential calculator 111 is installed between the state bank 107 and the receiving end 103 and receives inputs of the received sample sequence (104) and the symbol index (106) from the receiving end 103 and the selected sample section and the symbol index from the state bank 107. The differential calculator 111 determines a complex conjugate to the selected samples of the selected last-time visit through a conjugate calculator 113. Then it executes a complex multiplication to the received samples and the selected sample section of last-time visit to acquire a multiplied value through a complex multiplier 112. The difference between the symbol index from the receiving symbol sequence and the symbol index from the state bank is also calculated to obtain an index difference. The differential calculator outputs the multiplied value and the index difference. The accumulating and averaging unit 114 has inputs of the multiplied value and the index difference from the differential calculator 111. The accumulating and averaging unit 114 has a plurality of branches each corresponding to one index difference. The inputted multiplied value is dispatched to a corresponding branch 115 responsive to the index difference. The phase angle of the multiplied value is calculated by, for example, an inverse-tangent operation. The phase angles are scaled differently. The phase angle of each branch is divided by the index difference value of the branch. Finally, a weighted average operation is performed over the branches by a weighted average unit 119, thereby acquiring the frequency offset in the receiving unit. The state bank 107 further comprises a distributor 108 (in the preferred embodiment, a multiplexer), a plurality of state units 1071 and a simple selector 110 (in the preferred embodiment, a demultiplexer). The distributor 108 has inputs to the received sample sequence 104 and the symbol index 106 from the receiving end 103. It divides the sample sequence 104 into a plurality of sample section responsive to said symbol index 106 for distributing the sample sections and symbol indexes 106 to a corresponding state unit 1071 responsive to the selected state 1011 from the state selector 102. The plurality of state units receives and stores corresponding inputs of the data sample sections and the symbol index. Each state unit 1071 has a symbol memory 1072 for recording the sample section and an index memory 1073 for storing the symbol index 106 from the receiving end in response to the selected state. The symbol selector 110 serves for selecting the data symbol and the symbol index of the last-time visit responsive to the selected state from the state selection. Each of the branch further comprises an accumulator 116, a phase calculator 117 and a scale calculator 118. The accumulator 116 has an input of the multiplied value for accumulating the multiplied values and the index difference. The phase calculator serves for determining a phase of the multiplied value. The scale calculator 118 serves for determining a scale of the multiplied value.

Figure 2:
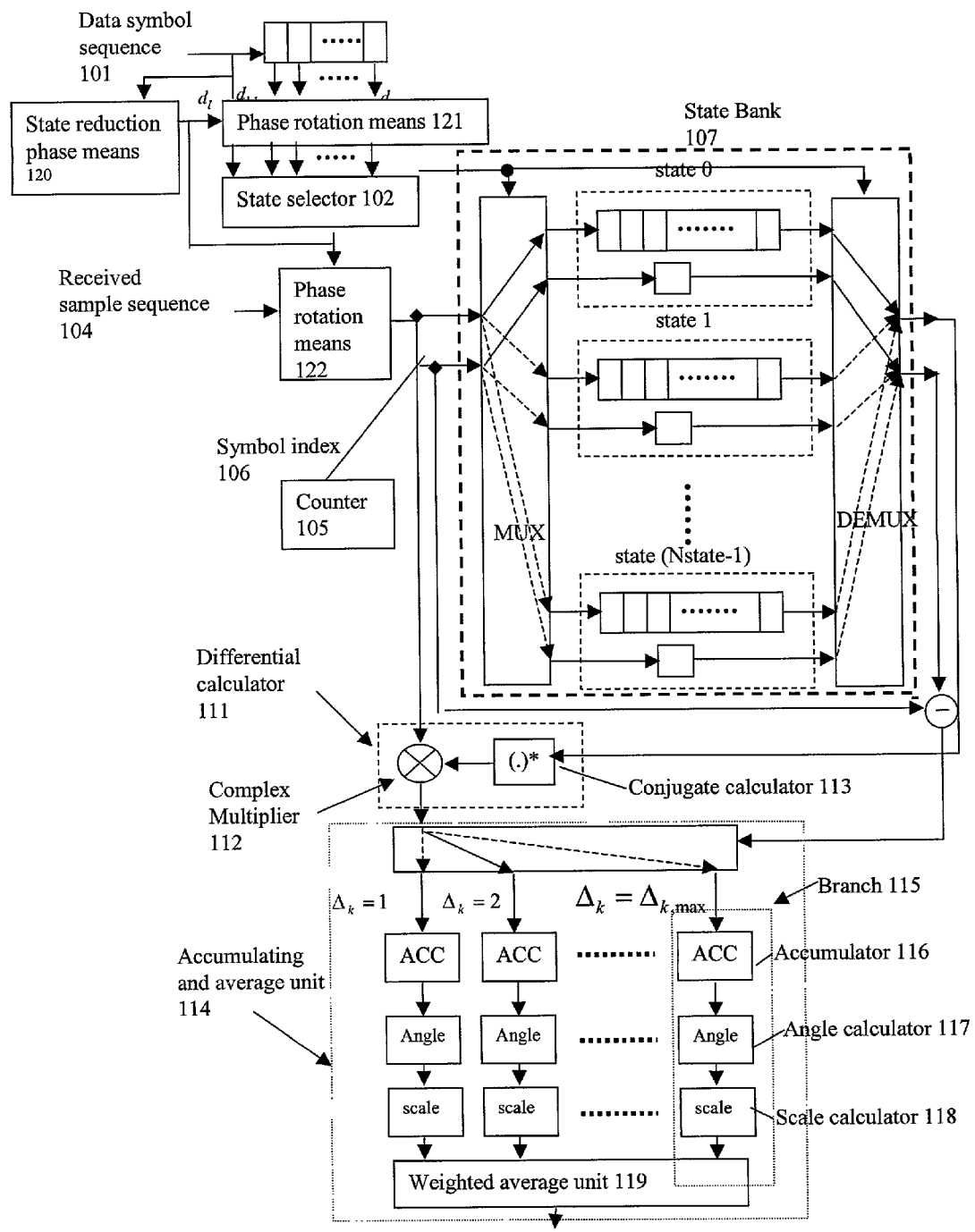
FIG. 2 shows the hardware implementations and block diagrams for the SDA algorithm with state reduction according to the present invention.

A block diagram with state reduction is shown in FIG. 2. A state reduction phase means 120 has an input of a selected data symbol from the plurality of data symbols 101 for calculating a phase of the selected data symbol, and outputs the phase of the selected data symbol. A first phase rotation means 121 receives the phase of the selected data symbol for rotating phases of other data symbols with the phase of the selected data symbol. A second phase rotation means 122 receives the phase of the selected data symbol for rotating phases of the receiving symbol sequence with the phase of the selected data symbol. As described above, the complex conjugate of the data symbol can be selected as the state-reduction phase. Other predetermined mapping from the data symbol to the phase is also possible. In general, the phase rotation block can be performed by the complex multiplication operation. When the phase rotation is only 0 or 180 degrees, only the polarity inverse is needed for phase rotation. When the phase rotation is 90 or 270 degrees, the real and imaginary parts are exchanged to perform the polarity inverse.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A frequency offset estimation method for utilizing in a communication system in the environment of an inter-symbol-interference channel with receiving unit, a plurality of data symbols and a receiving sample sequence generated by a plurality of continuously received receiving sample sections having a phase shift and an angular frequency offset, wherein each of said plurality of receiving sample sections is corresponding to one of said plurality of data symbols and contains a plurality of samples which are received continuously; the method comprising the steps of:
  (a) selecting a first and a second selected receiving sample sections from said plurality of receiving sample sections mapping to the same state of the data symbols and each of said two selected receiving sample sections being indicated by a symbol index; each symbol index being one of a plurality of continuous symbol indices integers corresponding respectively to continuous received receiving sample sections of said received sample sequence; and obtaining a symbol index difference by a difference of respective symbol indexes of said two selective receiving sample sections;
  (b) complex-multiplying two selective receiving samples of the two selected receiving sample sections, respectively, wherein one of said two selective receiving samples is taken complex conjugate before said complex multiplication, thereby, generating a multiplied value; and
  (c) repeating said steps (a), (b) for different samples of said two selected receiving sample sections, and for different samples of another different two selected receiving sample sections, respectively, of said plurality of said receiving sample sequence, thereby, generating a plurality of multiplied values; and a plurality of symbol index differences, respectively.
  (d) obtaining a plurality of generic terms generated from said plurality of multiplied values;
  (e) generating a plurality of phase angle values of said plurality of generic terms; and dividing said plurality of phase angle values by said plurality of symbol index differences, respectively thereby, generating a plurality of frequency offset estimations;
  (f) weighting-averaging said plurality of frequency offset estimations by corresponding weighting factors to generate an average frequency offset estimation.

2. The method of claim 1, wherein said step (a) further comprising the sub-steps of:
  (a. 1) defining a first state designated by a first segment of predetermined number n of said plurality of continuous data symbols;
  (a.2) separating said first receiving sample section from said received sample sequence responsive to said first segment of predetermined number n of said plurality of continuous data symbols;

(a.3) generating a symbol index corresponding to said first receiving sample section;

(a.4) storing said first receiving sample section and said symbol index as a stored receiving sample section and stored symbol index of the said first state;

(a.5) defining a second state designated by another segment of n continuous data symbols of said plurality of data symbols;

(a.6) comparing said second state with said first state;

(a.7) repeating said steps (a.2) to (a.4) to form another set of receiving sample section and symbol index for said receiving sample section and storing them as stored receiving sample section and stored symbol index of the said second state responsive to an inequality of said second state and said first state;

(a.8) separating said second receiving sample section from said received sample sequence responsive to said another segment of predetermined number n of said plurality of continuous data symbols, responsive to an equality of said second state and said first state; and (a.9) updating said stored receiving sample section and stored symbol index of the said first state by said second receiving sample section and symbol index of said second receiving sample section, responsive to an equality of said second state and said first state.

3. The method of claim 1, wherein said step (b) further comprising the steps of:

(a. 10) determining a complex conjugate value to a selected sample of said first selected receiving sample section; and (a.11) executing a complex multiplication to said complex conjugate value and a selected sample of said second selected receiving sample section which is at a corresponding position with respect to said selected sample of said first selected receiving sample section so as to acquire a multiplied value.

4. The method of claim 1, wherein said generic term is an accumulated value of selected multiplied values.

5. The method of claim 4, wherein said selected multiplied values are selected from any two receiving sample sections with the same symbol index difference there between.

6. The method of claim 1, wherein said generic term is said multiplied value.

7. The method of claim 1, wherein said plurality of data symbols is pre-stored in said receiving unit of said channel.

8. The method of claim 1, wherein said plurality of data symbols is detected by said receiving unit of said channel.

9. The method of claim 1, wherein in step (f), selection of said weighting factor minimizes the variance of the estimation.

10. The method of claim 1, wherein in step (f), equal weight is utilized.

11. The method of claim 4, wherein in step (f), weighting factors are selected to be proportional to a frequency of occurrences of each said index difference.

12. The method of claim 11, wherein in step (f), when statistics of said data symbol sequence are known and fixed, the weighting factors are calculated in advance from said statistics.

13. The method of claim 11, wherein a set of counters are used to dynamically count the number of occurrences of each of said index differences, and the counter values are utilized to generate said weighting factors.

14. The method of claim 1, wherein only one frequency offset value is obtained and said weighting factor of said only one frequency offset value is equal to one.

15. The method of claim 2, wherein said step (a.1) further comprises a state reduction step before determining said first state of calculating a phase rotation value responsive to a selected data symbol within said segment of n data symbols of said receiving symbol sequence, and then rotating phases of other data symbols within in said segment of n data symbols with said phase rotation value of said selected data symbol.

16. The method of claim 1, wherein said step (a.2) further comprises a step of rotating phase of said samples in said first selected receiving sample section with said phase rotation value of said selected data symbol.

17. The method of claim 1, wherein said communication system is a spread spectrum communication system.

18. A frequency offset estimation device utilized in an inter-symbol interference channel of a communication system, in a receiving unit of said channel, a plurality of data symbols being pre-stored or detected and a receiving sample sequence being received, wherein said receiving sample sequence has a phase shift and an angular frequency offset and is formed by a plurality of receiving sample sections; each of said plurality of receiving sample sections is corresponding to one of said plurality of data symbols and contains a plurality of samples which are received continuously; the device comprising:

a state selector for determining a first state from a plurality of predetermined states responsive to a first segment of a predetermined number of continuous data symbols; the state selector outputs said selected state;

a receiving end for receiving said received sample sequence and separating a first receiving sample section from said received sample sequence responsive to said first segment of a predetermined number of continuous data symbols, said receiving end outputting said received sample sequence;

a counter for sensing the separation of said first receiving sample section from said received sample sequence and then generating a first symbol index responsive to said first receiving sample section;

said counter outputting said symbol index; a state bank having inputs of said selected state from said state selector, said received sample sequence from said receiving end; and said first symbol index from the counter;

wherein said state bank stores a plurality of stored receiving sample sections and stored symbol indexes for said plurality of predetermined states;

outputting the stored receiving sample section and the stored symbol index of said selected state as the selected receiving sample section and the selected symbol index;

updating said stored receiving sample section and said stored symbol index of said selected state by said first receiving sample section and said first symbol index corresponding to said receiving sample sequence;

a differential calculator being installed between said state bank and said receiving end and receiving inputs of said received sample sequence and said first symbol index from said receiving end and said selected sample section and said selected symbol index from said state bank, wherein said differential calculator determines a complex conjugate of said selected sample section; and execute a complex multiplication to a sample of said first receiving sample section of said received sample sequence and a corresponding one of said selected sample section outputted from said state bank so as to acquire a multiplied value; and a difference between said symbol index of said first symbol index and said selected symbol index from said state bank is calculated to obtain an index difference;

said differential calculator outputting said multiplied value and said index difference; and an accumulating and averaging unit having inputs of the said multiplied value and said index difference from said differential calculator;

said accumulating and averaging unit having a plurality of branches each corresponding to one index difference, said multiplied value being dispatched to a corresponding branch responsive to said index difference, and calculating a phase angle of said multiplied value;

said phase angle in each branch being divided by said index difference of said branch;

finally, a weighted average operation being performed over different branches, thereby, a frequency offset estimation in the receiving unit being acquired.

19. The device of claim 18, wherein said state bank further comprising:

a distributor having inputs of said received sample sequence and said first symbol index from said receiving end;

said distributor separating a plurality of samples in said receiving sample sequence into a sample section responsive to said selected state and outputting said sample section and said symbol index; and a plurality of state units each receiving and storing said receiving sample section and said symbol index outputted from said distributor in response to said selected state;

each state unit having a symbol memory for storing sample section and an index memory for storing said symbol index from said receiving end in response to said selected state from said state selector; and a symbol selector for selecting said data symbol section and said symbol index corresponding to said sample section in response to said selected state from said state selector.

20. The device of claim 19, wherein said distributor is a multiplexer.

21. The device of claim 19, wherein said symbol selector is a demultiplexer.

22. The device of claim 18, wherein each of said branch further comprising:

an accumulator having an input of said multiplied value for accumulating said multiplied values;

a phase calculator having inputs from said accumulator for determining a phase of said multiplied value; and a scale calculator having inputs from said phase calculator for determining a scale of said multiplied value.

23. The device of claim 18, further comprises:

state reduction phase means having an input of a selected data symbol from said plurality of data symbols for calculating a phase rotation value responsive to said selected data symbol, and outputting said phase rotation value of said selected data symbol;

first phase rotation means receiving said phase rotation value of said selected data symbol for rotating phases of other data symbols with said phase rotation value of said selected data; and second phase rotation means receiving said phase rotation value of said selected data symbol for rotating phases of said receiving symbol sequence with said phase rotation value of said selected data.

24. The device of claim 23, wherein a complex conjugate of said selected data symbol is selected as a state-reduction phase.

25. The circuit of claim 23, wherein a predetermined mapping from said data symbol to said phase is used in selecting a state-reduction phase.

* * * * *